United States Patent
Mavliev et al.

(10) Patent No.: US 7,520,968 B2
(45) Date of Patent: Apr. 21, 2009

(54) CONDUCTIVE PAD DESIGN MODIFICATION FOR BETTER WAFER-PAD CONTACT

(75) Inventors: Rashid A. Mavliev, Campbell, CA (US); Lakshmanan Karuppiah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 369 days.

(21) Appl. No.: 11/243,488

(22) Filed: Oct. 4, 2005

(65) Prior Publication Data

US 2006/0073768 A1    Apr. 6, 2006

Related U.S. Application Data

(60) Provisional application No. 60/616,028, filed on Oct. 5, 2004.

(51) Int. Cl.
   *C25B 9/00*    (2006.01)
(52) U.S. Cl. .............. 204/279; 204/224 M; 204/224 R; 451/533; 451/534; 451/539; 205/653; 205/662; 205/663
(58) Field of Classification Search ................. 204/279, 204/224 M, 224 R; 451/533, 534, 539; 205/653, 205/662, 663
   See application file for complete search history.

(56) References Cited

U.S. PATENT DOCUMENTS

| | | | |
|---|---|---|---|
| 1,601,642 A | 9/1926 | Parker | |
| 1,927,162 A | 9/1933 | Fiedler et al. | |
| 2,112,691 A | 3/1938 | Crowder | |
| 2,240,265 A | 4/1941 | Nachtman | |
| 2,392,687 A | 1/1946 | Nachtman | |
| 2,431,065 A | 11/1947 | Miller | |
| 2,451,341 A | 10/1948 | Jernstedt | |
| 2,453,481 A | 11/1948 | Wilson | |
| 2,454,935 A | 11/1948 | Miller | |
| 2,456,185 A | 12/1948 | Grube | |
| 2,457,510 A | 12/1948 | van Omum | |
| 2,458,676 A | 1/1949 | Brenner et al. | |

(Continued)

FOREIGN PATENT DOCUMENTS

EP    0 325 753    8/1989

(Continued)

OTHER PUBLICATIONS

Alexander, Jr., "Electrically Conductive Polymer Nanocomposite Materials", http://www.afrlhorizons.com/Briefs/Sept02/ML0206.html, Date Unknown.

(Continued)

*Primary Examiner*—Bruce F Bell
(74) *Attorney, Agent, or Firm*—Patterson & Sheridan

(57) ABSTRACT

An apparatus and method for manufacturing and refurbishing a conductive polishing pad assembly for performing an electrochemical process on a substrate is disclosed. The conductive polishing pad assembly is formed using a contact surface as a foundation that is coated with a metallic coating to create a conductive contact surface. In one embodiment, the metallic coating is a high purity tin/zinc alloy that is sprayed on the contact surface. The contact surface contains abrasive particles while the metallic coating provides at least conductive qualities to the contact surface.

20 Claims, 5 Drawing Sheets

U.S. PATENT DOCUMENTS

| | | |
|---|---|---|
| 2,461,556 A | 2/1949 | Lorig |
| 2,473,290 A | 6/1949 | Millard |
| 2,477,808 A | 8/1949 | Jones |
| 2,479,323 A | 8/1949 | Davis |
| 2,480,022 A | 8/1949 | Hogaboom |
| 2,490,055 A | 12/1949 | Hotl |
| 2,495,695 A | 1/1950 | Camin et al. |
| 2,500,205 A | 3/1950 | Schaefer |
| 2,500,206 A | 3/1950 | Schaefer et al. |
| 2,503,863 A | 4/1950 | Bart |
| 2,506,794 A | 5/1950 | Kennedy et al. |
| 2,509,304 A | 5/1950 | Klein |
| 2,512,328 A | 6/1950 | Hays |
| 2,517,907 A | 8/1950 | Mikulas |
| 2,519,945 A | 8/1950 | Twele et al. |
| 2,530,677 A | 11/1950 | Berkenkotter et al. |
| 2,535,966 A | 12/1950 | Teplitz |
| 2,536,912 A | 1/1951 | Corbertt |
| 2,539,898 A | 1/1951 | Davis |
| 2,540,175 A | 2/1951 | Rosenqvist |
| 2,544,510 A | 3/1951 | Prahl |
| 2,549,678 A | 4/1951 | Fiandt |
| 2,554,943 A | 5/1951 | Farmer |
| 2,556,017 A | 6/1951 | Vonada |
| 2,560,534 A | 7/1951 | Adler |
| 2,560,966 A | 7/1951 | Lee |
| 2,569,577 A | 10/1951 | Reading |
| 2,569,578 A | 10/1951 | Rieger |
| 2,571,709 A | 10/1951 | Gray |
| 2,576,074 A | 11/1951 | Nachtman |
| 2,587,630 A | 3/1952 | Konrad et al. |
| 2,619,454 A | 11/1952 | Zapponi |
| 2,633,452 A | 3/1953 | Hogaboom, Jr. et al. |
| 2,646,398 A | 7/1953 | Henderson |
| 2,656,283 A | 10/1953 | Fink et al. |
| 2,656,284 A | 10/1953 | Toulmin |
| 2,657,177 A | 10/1953 | Rendet |
| 2,657,457 A | 11/1953 | Toulmin |
| 2,673,836 A | 3/1954 | Vonada |
| 2,674,550 A | 4/1954 | Dunlevy et al. |
| 2,675,348 A | 4/1954 | Greenspan |
| 2,680,710 A | 6/1954 | Kenmore et al. |
| 2,684,939 A | 7/1954 | Geese |
| 2,689,215 A | 9/1954 | Bart |
| 2,695,269 A | 11/1954 | de Witz et al. |
| 2,696,859 A | 12/1954 | Somma |
| 2,698,832 A | 1/1955 | Swanson |
| 2,706,173 A | 4/1955 | Wells et al. |
| 2,706,175 A | 4/1955 | Licharz |
| 2,708,445 A | 5/1955 | Manson et al. |
| 2,710,834 A | 6/1955 | Vrilakas |
| 2,711,993 A | 6/1955 | Lyon |
| 3,162,588 A | 12/1964 | Bell |
| 3,334,041 A | 8/1967 | Dyer et al. |
| 3,433,730 A | 3/1969 | Kennedy et al. |
| 3,448,023 A | 6/1969 | Bell |
| 3,476,677 A | 11/1969 | Corley et al. |
| 3,607,707 A | 9/1971 | Chenevier |
| 3,873,512 A | 3/1975 | Latanision |
| 3,942,959 A | 3/1976 | Markoo et al. |
| 3,992,178 A | 11/1976 | Markoo et al. |
| 4,047,902 A | 9/1977 | Wiand |
| 4,082,638 A | 4/1978 | Jumer |
| 4,119,515 A | 10/1978 | Costakis |
| 4,125,444 A | 11/1978 | Inoue |
| 4,312,716 A | 1/1982 | Maschler et al. |
| 4,523,411 A | 6/1985 | Freerks |
| 4,704,511 A | 11/1987 | Miyano |
| 4,713,149 A | 12/1987 | Hoshino |
| 4,752,371 A | 6/1988 | Kreisel et al. |
| 4,772,361 A | 9/1988 | Dorsett et al. |
| 4,793,895 A | 12/1988 | Kaanta et al. |
| 4,839,993 A | 6/1989 | Masuko et al. |
| 4,934,102 A | 6/1990 | Leach et al. |
| 4,954,141 A | 9/1990 | Takiyama et al. |
| 4,956,056 A | 9/1990 | Zubatova et al. |
| 5,011,510 A | 4/1991 | Hayakawa et al. |
| 5,061,294 A | 10/1991 | Harmer et al. |
| 5,066,370 A | 11/1991 | Andreshak et al. |
| 5,096,550 A | 3/1992 | Mayer et al. |
| 5,108,463 A | 4/1992 | Buchanan |
| 5,136,817 A | 8/1992 | Tabata et al. |
| 5,137,542 A | 8/1992 | Buchanan et al. |
| 5,203,884 A | 4/1993 | Buchanan et al. |
| 5,217,586 A | 6/1993 | Datta et al. |
| 5,225,034 A | 7/1993 | Yu et al. |
| 5,257,478 A | 11/1993 | Hyde et al. |
| 5,328,716 A | 7/1994 | Buchanan |
| 5,478,435 A | 12/1995 | Murphy et al. |
| 5,534,106 A | 7/1996 | Cote et al. |
| 5,543,032 A | 8/1996 | Datta et al. |
| 5,560,753 A | 10/1996 | Schnabel et al. |
| 5,562,529 A | 10/1996 | Kishii et al. |
| 5,567,300 A | 10/1996 | Datta et al. |
| 5,575,706 A | 11/1996 | Tsai et al. |
| 5,578,362 A | 11/1996 | Reinhardt et al. |
| 5,624,300 A | 4/1997 | Kishii et al. |
| 5,633,068 A | 5/1997 | Ryoke et al. |
| 5,654,078 A | 8/1997 | Ferronato |
| 5,674,122 A | 10/1997 | Krech |
| 5,702,811 A | 12/1997 | Ho et al. |
| 5,738,574 A | 4/1998 | Tolles et al. |
| 5,804,507 A | 9/1998 | Perlov et al. |
| 5,807,165 A | 9/1998 | Uzoh et al. |
| 5,823,854 A | 10/1998 | Chen |
| 5,840,190 A | 11/1998 | Scholander et al. |
| 5,840,629 A | 11/1998 | Carpio |
| 5,846,882 A | 12/1998 | Birang |
| 5,871,392 A | 2/1999 | Meikle et al. |
| 5,882,491 A | 3/1999 | Wardle |
| 5,893,796 A | 4/1999 | Birang et al. |
| 5,911,619 A | 6/1999 | Uzoh et al. |
| 5,938,801 A | 8/1999 | Robinson |
| 5,948,697 A | 9/1999 | Hata |
| 5,985,093 A | 11/1999 | Chen |
| 6,001,008 A | 12/1999 | Fujimori et al. |
| 6,004,880 A | 12/1999 | Liu et al. |
| 6,017,265 A | 1/2000 | Cook et al. |
| 6,020,264 A | 2/2000 | Lustig et al. |
| 6,024,630 A | 2/2000 | Shendon et al. |
| 6,033,293 A | 3/2000 | Crevasse et al. |
| 6,056,851 A | 5/2000 | Hsieh et al. |
| 6,066,030 A | 5/2000 | Uzoh |
| 6,074,284 A | 6/2000 | Tani et al. |
| 6,077,337 A | 6/2000 | Lee |
| 6,090,239 A | 7/2000 | Liu et al. |
| 6,103,096 A | 8/2000 | Datta et al. |
| 6,116,998 A | 9/2000 | Damgaard et al. |
| 6,132,292 A | 10/2000 | Kubo |
| 6,153,043 A | 11/2000 | Edelstein et al. |
| 6,156,124 A | 12/2000 | Tobin |
| 6,159,079 A | 12/2000 | Zuniga et al. |
| 6,171,467 B1 | 1/2001 | Weihs et al. |
| 6,176,992 B1 | 1/2001 | Talieh |
| 6,176,998 B1 | 1/2001 | Wardle et al. |
| 6,183,354 B1 | 2/2001 | Zuniga et al. |
| 6,190,494 B1 | 2/2001 | Dow |
| 6,210,257 B1 | 4/2001 | Carlson |
| 6,234,870 B1 | 5/2001 | Uzoh et al. |
| 6,238,271 B1 | 5/2001 | Cesna |
| 6,238,592 B1 | 5/2001 | Hardy et al. |
| 6,244,935 B1 | 6/2001 | Birang et al. |
| 6,248,222 B1 | 6/2001 | Wang |
| 6,251,235 B1 | 6/2001 | Talieh et al. |

| | | |
|---|---|---|
| 6,257,953 B1 | 7/2001 | Gitis et al. |
| 6,258,223 B1 | 7/2001 | Cheung et al. |
| 6,261,168 B1 | 7/2001 | Jensen et al. |
| 6,261,959 B1 | 7/2001 | Travis et al. |
| 6,273,798 B1 | 8/2001 | Berman |
| 6,296,557 B1 | 10/2001 | Walker |
| 6,297,159 B1 | 10/2001 | Paton |
| 6,319,108 B1 | 11/2001 | Adefris et al. |
| 6,319,420 B1 | 11/2001 | Dow |
| 6,322,422 B1 | 11/2001 | Satou |
| 6,328,642 B1 | 12/2001 | Pant et al. |
| 6,328,872 B1 | 12/2001 | Talieh et al. |
| 6,331,135 B1 | 12/2001 | Sabde et al. |
| 6,368,184 B1 | 4/2002 | Beckage |
| 6,368,190 B1 | 4/2002 | Easter et al. |
| 6,372,001 B1 | 4/2002 | Omar et al. |
| 6,379,223 B1 | 4/2002 | Sun et al. |
| 6,381,169 B1 | 4/2002 | Bocian et al. |
| 6,383,066 B1 | 5/2002 | Chen et al. |
| 6,386,956 B1 | 5/2002 | Sato et al. |
| 6,391,166 B1 | 5/2002 | Wang |
| 6,395,152 B1 | 5/2002 | Wang |
| 6,402,591 B1 | 6/2002 | Thornton |
| 6,406,363 B1 | 6/2002 | Xu et al. |
| 6,409,904 B1 | 6/2002 | Uzoh et al. |
| 6,413,388 B1 | 7/2002 | Uzoh et al. |
| 6,428,394 B1 | 8/2002 | Mooring et al. |
| 6,431,968 B1 | 8/2002 | Chen et al. |
| 6,440,295 B1 | 8/2002 | Wang |
| 6,447,668 B1 | 9/2002 | Wang |
| 6,471,847 B2 | 10/2002 | Talieh et al. |
| 6,475,332 B1 | 11/2002 | Boyd et al. |
| 6,497,800 B1 | 12/2002 | Talieh et al. |
| 6,517,426 B2 | 2/2003 | Lee |
| 6,520,843 B1 | 2/2003 | Halley |
| 6,537,140 B1 | 3/2003 | Miller et al. |
| 6,537,144 B1 | 3/2003 | Tsai et al. |
| 6,551,179 B1 | 4/2003 | Halley |
| 6,561,873 B2 | 5/2003 | Tsai et al. |
| 6,561,889 B1 | 5/2003 | Xu et al. |
| 6,569,004 B1 | 5/2003 | Pham |
| 6,572,463 B1 | 6/2003 | Xu et al. |
| 6,585,579 B2 | 7/2003 | Jensen et al. |
| 6,630,059 B1 | 10/2003 | Uzoh et al. |
| 6,641,471 B1 | 11/2003 | Pinheiro et al. |
| 6,656,019 B1 | 12/2003 | Chen et al. |
| 6,685,548 B2 | 2/2004 | Chen et al. |
| 6,692,338 B1 | 2/2004 | Kirchner |
| 6,739,951 B2 | 5/2004 | Sun et al. |
| 6,752,700 B2 | 6/2004 | Duescher |
| 6,769,969 B1 | 8/2004 | Duescher |
| 6,802,955 B2 | 10/2004 | Emesh et al. |
| 6,848,977 B1 | 2/2005 | Cook et al. |
| 6,856,761 B2 | 2/2005 | Doran |
| 6,962,524 B2 | 11/2005 | Butterfield et al. |
| 2001/0005667 A1 | 6/2001 | Tolles et al. |
| 2001/0024878 A1 | 9/2001 | Nakamura |
| 2001/0027018 A1 | 10/2001 | Molnar |
| 2001/0035354 A1 | 11/2001 | Ashjaee et al. |
| 2001/0036746 A1 | 11/2001 | Sato et al. |
| 2001/0040100 A1 | 11/2001 | Wang |
| 2001/0042690 A1 | 11/2001 | Talieh |
| 2002/0008036 A1 | 1/2002 | Wang |
| 2002/0011417 A1 | 1/2002 | Talieh et al. |
| 2002/0020621 A1 | 2/2002 | Uzoh et al. |
| 2002/0025760 A1 | 2/2002 | Lee et al. |
| 2002/0025763 A1 | 2/2002 | Lee et al. |
| 2002/0070126 A1 | 6/2002 | Sato et al. |
| 2002/0077037 A1 | 6/2002 | Tietz |
| 2002/0088715 A1 | 7/2002 | Talieh et al. |
| 2002/0102853 A1 | 8/2002 | Li et al. |
| 2002/0108861 A1 | 8/2002 | Emesh et al. |
| 2002/0119286 A1 | 8/2002 | Chen et al. |
| 2002/0123300 A1 | 9/2002 | Jones et al. |
| 2002/0130049 A1 | 9/2002 | Chen et al. |
| 2002/0130634 A1 | 9/2002 | Ziemkowski et al. |
| 2002/0146963 A1 | 10/2002 | Teetzel |
| 2002/0148732 A1 | 10/2002 | Emesh et al. |
| 2003/0013397 A1 | 1/2003 | Rhoades |
| 2003/0034131 A1 | 2/2003 | Park et al. |
| 2003/0040188 A1 | 2/2003 | Hsu et al. |
| 2003/0114087 A1 | 6/2003 | Duboust et al. |
| 2003/0116445 A1 | 6/2003 | Sun et al. |
| 2003/0116446 A1 | 6/2003 | Duboust et al. |
| 2003/0209448 A1 | 11/2003 | Hu et al. |
| 2003/0213703 A1 | 11/2003 | Wang et al. |
| 2003/0220053 A1 | 11/2003 | Manens et al. |
| 2004/0020788 A1 | 2/2004 | Mavliev et al. |
| 2004/0020789 A1 | 2/2004 | Hu |
| 2004/0023495 A1 | 2/2004 | Butterfield et al. |
| 2004/0082288 A1 | 4/2004 | Tietz et al. |
| 2004/0121708 A1 | 6/2004 | Hu et al. |
| 2004/0134792 A1 | 7/2004 | Butterfield et al. |
| 2004/0163946 A1 | 8/2004 | Chang et al. |
| 2004/0266327 A1 | 12/2004 | Chen et al. |
| 2005/0000801 A1 | 1/2005 | Wang et al. |
| 2005/0092621 A1* | 5/2005 | Hu et al. ............... 205/668 |
| 2005/0133363 A1 | 6/2005 | Hu et al. |
| 2005/0161341 A1 | 7/2005 | Duboust et al. |
| 2005/0178666 A1 | 8/2005 | Tsai et al. |
| 2005/0194681 A1 | 9/2005 | Hu et al. |
| 2006/0070872 A1* | 4/2006 | Mavliev et al. ......... 204/224 M |

FOREIGN PATENT DOCUMENTS

| | | |
|---|---|---|
| EP | 0 455 455 | 11/1991 |
| EP | 1 361 023 | 11/2003 |
| JP | 58-171264 | 10/1983 |
| JP | 61-079666 | 4/1986 |
| JP | 61-265279 | 11/1986 |
| JP | 63-028512 | 2/1988 |
| JP | 05-277957 | 10/1993 |
| JP | 10-006213 | 1/1998 |
| JP | 11-042554 | 2/1999 |
| JP | 2870537 | 3/1999 |
| JP | 11-239961 | 7/1999 |
| JP | 2000-218513 | 8/2000 |
| JP | 2001-77117 | 3/2001 |
| JP | 2001-179611 | 7/2001 |
| JP | 2001-244223 | 9/2001 |
| JP | 2002-334858 | 11/2002 |
| JP | 2003-037158 | 5/2003 |
| JP | 3453352 | 10/2003 |
| SU | 1618538 | 1/1991 |
| WO | WO 93/15879 | 8/1993 |
| WO | WO 98/49723 | 11/1998 |
| WO | WO 99/41434 | 8/1999 |
| WO | WO 99/53119 | 10/1999 |
| WO | WO 99/65072 | 12/1999 |
| WO | WO 00/03426 | 1/2000 |
| WO | WO 00/26443 | 5/2000 |
| WO | WO 00/33356 | 6/2000 |
| WO | WO 00/59682 | 10/2000 |
| WO | WO 01/13416 | 2/2001 |
| WO | WO 01/49452 | 7/2001 |
| WO | WO 01/52307 | 7/2001 |
| WO | WO 01/63018 | 8/2001 |
| WO | WO 01/71066 | 9/2001 |
| WO | WO 01/88229 | 11/2001 |
| WO | WO 01/88954 | 11/2001 |
| WO | WO 02/23616 | 3/2002 |
| WO | WO 02/064314 | 8/2002 |
| WO | WO 02/075804 | 9/2002 |

WO WO 03/001581 1/2003

OTHER PUBLICATIONS

Contolini, "Electrochemical Planarization of ULSI Copper," Solid State Technology, vol. 40, No. 6, Jun. 1, 1997.
Nogami, "An Innovation in Integrate Porous Low-K Materials and Copper," InterConnect Japan 2001; Honeywell Seminar Dec. 6, 2001, p. 1-12.
Partial International Search / PCT Invitation to pay additional fees dated Nov. 14, 2002 (4100 PC 02).
Notification regarding review of justification for invitation to pay additional fees for PCT/US/02/11009 (4100 PC 02) dated Feb. 25, 2003.
International Search Report for PCT/US 02/11009 (4100 EP 02) dated Feb. 25, 2003.
PCT Written Opinion dated Apr. 1, 2003 for PCT/US02/1109. (4100 EP 02).
Notification of Transmittal of International Preliminary Examination Report dated Nov. 10, 2003 (4100 EP 02).
European Search Report for 03252801.0, dated Jan. 16, 2004 (7047 EP).
Communication pursuant to Article 96(2) EPC for Application No. 02728965.4, dated Jun. 11, 2004 (4100 EP 02).
Search Report issued by the Austrian Patent Office for corresponding Singapore Patent Application No. 200302562-4, provided by letter dated Oct. 7, 2004.
Invitation to pay additional fees dated Nov. 11, 2004 (4100 P5 PCT).
Notification of Transmittal of International Search Report and Written Opinion dated Feb. 21, 2005 (4100 PCT).
Notification of transmittal of the International Search report and Written Opinion dated Mar. 14, 2005 (4100 P5 PCT).
PCT International Search Report and Written Opinion dated Apr. 28, 2005 for PCT/US04/037870.
EP Search Report for Application No. 03254807.5 dated Sep. 27, 2005.
Invitation To Pay Additional Fees And Partial Search Report For PCT/US2005/035768, Dated Feb. 14, 2006.
International Search Report for International Application No. PCT/US 2005/035768 dated May 9, 2006.
Written Opinion of the International Searching Authority for International Application No. PCT/US2005/035768 dated May 9, 2008.

* cited by examiner

CONDUCTIVE PAD DESIGN MODIFICATION FOR BETTER WAFER-PAD CONTACT

CROSS-REFERENCE TO RELATED APPLICATIONS

This application claims benefit of U.S. provisional patent application Ser. No. 60/616,028, filed Oct. 5, 2004, which is herein incorporated by reference.

BACKGROUND OF THE INVENTION

1. Field of the Invention

Embodiments of the present invention generally relate to a processing apparatus for planarizing or polishing a substrate. More particularly, the invention relates to polishing pad design for planarizing or polishing a semiconductor wafer by electrochemical mechanical planarization.

2. Description of the Related Art

In the fabrication of integrated circuits and other electronic devices on substrates, multiple layers of conductive, semiconductive, and dielectric materials are deposited on or removed from a feature side, i.e., a deposit receiving surface, of a substrate. As layers of materials are sequentially deposited and removed, the feature side of the substrate may become non-planar and require planarization. Planarization is a procedure where previously deposited material is removed from the feature side of a substrate to form a generally even, planar or level surface. The process is useful in removing undesired surface topography and surface defects, such as rough surfaces, agglomerated materials, crystal lattice damage and scratches. The planarization process is also useful in forming features on a substrate by removing excess deposited material used to fill the features and to provide an even or level surface for subsequent deposition and processing.

Chemical mechanical polishing (CMP) and Electrochemical Mechanical Planarization (ECMP) are two exemplary processes used to remove materials from the feature side of a substrate. In one exemplary CMP process, a web-type CMP pad containing abrasive particles is adapted to contact the feature side of the substrate using physical abrasion to remove materials. The CMP pad is attached to an apparatus having a rotating platen assembly. The apparatus also has a substrate carrier, such as a polishing head, that is mounted on a carrier assembly above the pad that holds a substrate. The polishing head places the substrate in contact with the pad and is adapted to provide downward pressure, controllably urging the substrate against the pad. The pad is moved relative to the substrate by an external driving force and the polishing head typically moves relative to the moving pad. Typically, the CMP pad includes a plurality of raised portions surrounded by a plurality of depressions. The raised portions of the CMP pad are distributed in a uniform pattern which provides uniform contact to the feature side of the substrate during operation.

The ECMP process typically uses a pad having conductive properties adapted to combine physical abrasion with electrochemical activity that enhances the removal of materials from the feature side of the substrate. The pad is attached to an apparatus having a rotating platen assembly that is adapted to couple the pad to a power source. The apparatus also has a polishing head that is mounted on a carrier assembly above the pad that holds the substrate. The polishing head places the substrate in contact with the pad and is adapted to provide downward pressure, controllably urging the substrate against the pad. The pad is moved relative to the substrate by an external driving force and the polishing head typically moves relative to the moving pad. A chemical composition, such as an electrolyte, is typically provided to the surface of the pad which enhances electrochemical activity between the pad and the substrate. The ECMP apparatus effects abrasive or polishing activity from frictional movement while the electrolyte combined with the conductive properties of the pad selectively removes material from the feature side of the substrate.

Although ECMP has produced good results in recent years, there is an ongoing effort to develop pads with improved polishing qualities combined with optimal electrical properties that will not degrade over time and require less conditioning, thus providing extended periods of use with less downtime for replacement. Inherent in this challenge is the difficulty in producing a pad that will not react with process chemistry, which may cause degradation, or require excessive conditioning.

Typical pads used in this process have an upper surface to contact the feature side of the substrate that is substantially flat. Variations may include slightly raised projections that extend from the pad's upper surface. This upper surface may not sufficiently contact the feature side of the substrate, possibly leaving regions of the feature side without sufficient or stable electrical bias. This regional or intermittent bias may adversely affect the polishing process.

Therefore, there is a need for a planarizing or polishing pad with an upper surface that combines the uniform contact of a CMP pad with the conductive properties of an ECMP pad in order to provide abrasion while communicating a stable electrical bias to the feature side of the substrate.

SUMMARY OF THE INVENTION

The present invention generally provides an article of manufacture and an apparatus for planarizing a layer on a substrate using electrochemical dissolution processes, polishing processes, and/or combinations thereof.

In one embodiment, a pad assembly for polishing a substrate is described. The pad assembly includes a contact surface having a plurality of posts and a plurality of interstitial areas disposed on a backing, and a subpad coupled to the backing. The subpad is adapted to be disposed on an electrode. A conductive coating is applied to at least a bottom of the plurality of interstitial areas.

In another embodiment, a pad assembly for polishing a substrate is described. The pad assembly is adapted to couple to a power source and includes a first conductive layer having a contact surface having a conductive coating formed thereon adapted to polish the substrate. The pad assembly further includes a second conductive layer coupled to and disposed below the first conductive layer with a subpad therebetween. The second conductive layer is adapted to receive a voltage from the power source that is different than the first conductive layer.

In another embodiment, a method of manufacturing a pad assembly for polishing a substrate is described. The method includes providing a contact surface having a plurality of posts and a plurality of interstitial areas therebetween, coupling the contact surface to a subpad, applying a conductive coating to the contact surface, and forming a plurality of perforations therethrough.

In another embodiment, a method of refurbishing a conductive pad is described. The method includes providing a contact surface having a plurality of posts and a plurality of interstitial areas therebetween, the contact surface coupled to a subpad, spraying a conductive coating on the contact surface, and packaging the contact surface and the subpad for subsequent installation to a platen assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
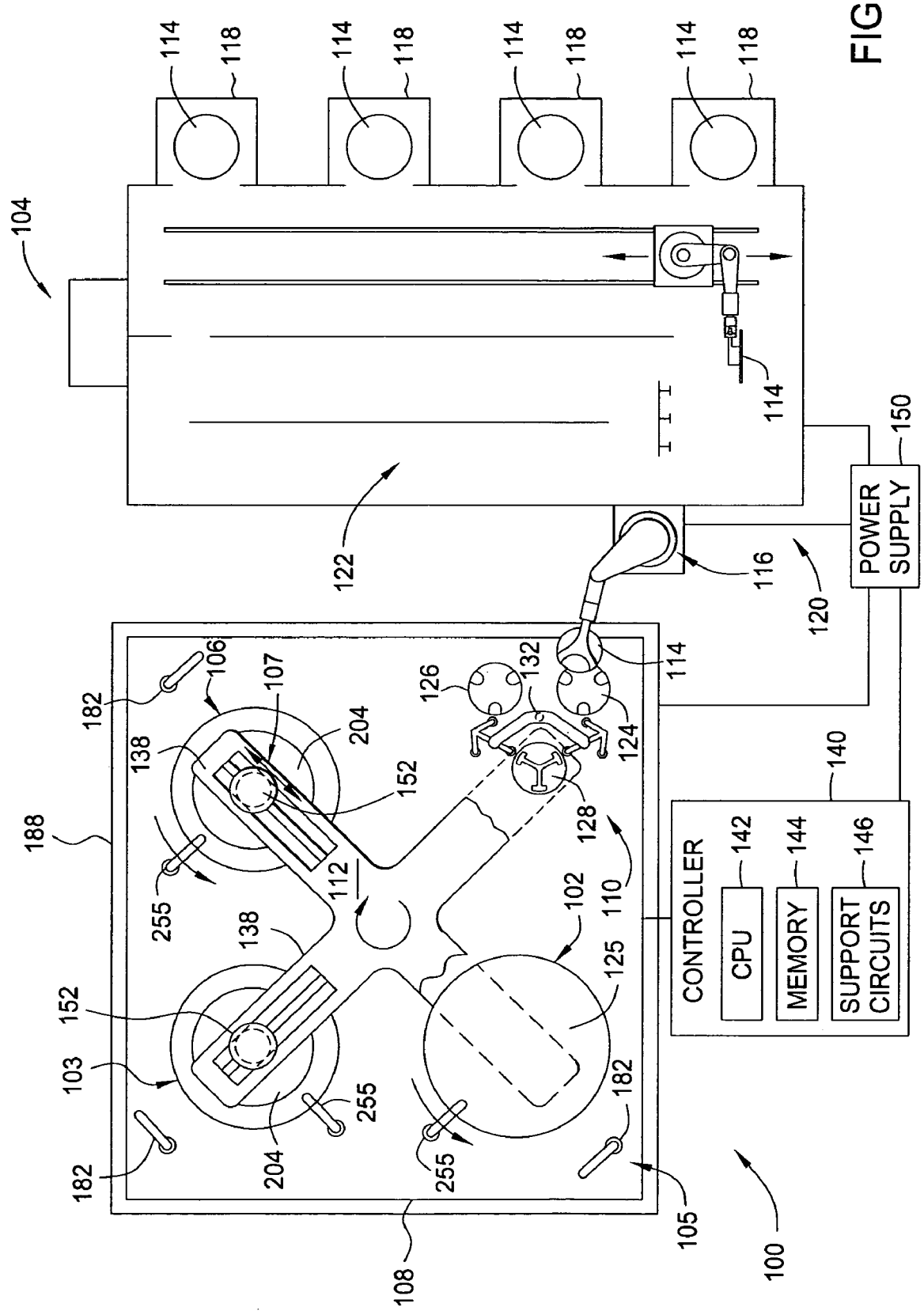
FIG. 1 is a plan view of one embodiment of a polishing apparatus.

FIG. 1 depicts a processing apparatus 100 having a planarizing module 105 that is suitable for electrochemical mechanical polishing and chemical mechanical polishing. The planarizing module 105 includes at least one electrochemical mechanical planarization (ECMP) station 102, and optionally, at least one conventional chemical mechanical planarization (CMP) station 106 disposed in an environmentally controlled enclosure 188. Examples of planarizing modules 105 that may be adapted to benefit from the invention include MIRRA®, MIRRA MESA™, REFLEXION®, REFLEXION LK®, REFLEXION LK Ecmp™ Chemical Mechanical Planarizing Systems, all available from Applied Materials, Inc. located in Santa Clara, Calif. Other planarizing modules commonly used in the art may also be adapted to benefit from the invention.

For example, in the planarizing module 105 shown in FIG. 1, the apparatus includes a first ECMP station 102, a second ECMP station 103, and one CMP station 106. The stations may be used for processing a substrate surface in three steps. For example, a substrate having feature definitions formed therein and filled with a barrier layer and then a conductive material disposed over the barrier layer may have the conductive material removed in two steps in the two ECMP stations 102, 103, with the barrier layer processed in the conventional CMP station 106 to form a planarized surface on the substrate. Alternatively, the CMP station 106 may be adapted to perform an ECMP process configured to remove the barrier material as well as any residual material. It is to be noted that either of the stations 102, 103, and 106 may also be adapted to deposit a material on a substrate by an electrochemical mechanical plating process (ECMPP), wherein the polarity of the bias provided to the pad is adjusted to deposit material on the substrate.

The exemplary apparatus 100 generally includes a base 108 that supports one or more ECMP stations 102, 103, one or more polishing stations 106, a transfer station 110, conditioning devices 182, and a carousel 112. The transfer station 110 generally facilitates transfer of substrates 114 to and from the apparatus 100 via a loading robot 116. The loading robot 116 typically transfers substrates 114 between the transfer station 110 and a factory interface 120 that may include a cleaning module 122, a metrology device 104 and one or more substrate storage cassettes 118.

Alternatively, the loading robot 116 (or factory interface 120) may transfer substrates to one or more other processing tools (not shown) such as a chemical vapor deposition tool, physical vapor deposition tool, etch tool and the like.

In this exemplary embodiment, the transfer station 110 comprises at least an input buffer station 124, an output buffer station 126, a transfer robot 132, and a load cup assembly 128. The loading robot 116 places the substrate 114 onto the input buffer station 124. The transfer robot 132 has two gripper assemblies, each having pneumatic gripper fingers that hold the substrate 114 by the substrate's edge. The transfer robot 132 lifts the substrate 114 from the input buffer station 124 and rotates the gripper and substrate 114 to position the substrate 114 over the load cup assembly 128, then places the substrate 114 down onto the load cup assembly 128. An example of a transfer station that may be used is described in U.S. Pat. No. 6,156,124, which issued Dec. 5, 2000, entitled "Wafer Transfer Station for a Chemical Mechanical Polisher," which is incorporated herein by reference to the extent it is not inconsistent with this disclosure.

The carousel 112 generally supports a plurality of planarizing or carrier heads 204, each of which retains one substrate 114 during processing. The carousel 112 articulates the carrier heads 204 between the transfer station 110, the one or more ECMP stations 102, 103 and the one or more polishing stations 106. One carousel that may be adapted to benefit from the invention is generally described in U.S. Pat. No. 5,804,507, issued Sep. 8, 1998, entitled "Radially Oscillating Carousel Processing System for Chemical Mechanical Polishing," which is hereby incorporated by reference to the extent the application is not inconsistent with this disclosure.

Generally, the carousel 112 is centrally disposed on the base 108. The carousel 112 typically includes a plurality of arms 138. Each arm 138 generally supports one of the planarizing or carrier heads 204. Two of the arms 138 depicted in FIG. 1 are shown in phantom so that the transfer station 110 and the planarizing surface 125 of ECMP station 102 may be seen. The carousel 112 is indexable such that the carrier head 204 may be moved between the stations 102, 103, 106 and the transfer station 110 in a sequence defined by the user.

Generally the carrier head 204 retains the substrate 114 while the substrate 114 is disposed in the ECMP stations 102, 103 or polishing station 106. The arrangement of the ECMP stations 102, 103 and polishing stations 106 on the apparatus 100 allow for the substrate 114 to be sequentially processed by moving the substrate between stations while being retained in the same carrier head 204.

To facilitate control of the polishing apparatus 100 and processes performed thereon, a controller 140 comprising a central processing unit (CPU) 142, memory 144, and support circuits 146, is connected to the polishing apparatus 100. The CPU 142 may be one of any form of computer processor that can be used in an industrial setting for controlling various drives and pressures. The memory 144 is connected to the CPU 142. The memory 144, or computer-readable medium, may be one or more of readily available memory such as random access memory (RAM), read only memory (ROM), floppy disk, hard disk, or any other form of digital storage, local or remote. The support circuits 146 are connected to the CPU 142 for supporting the processor in a conventional manner. These circuits include cache, power supplies, clock circuits, input/output circuitry, subsystems, and the like.

Power to operate the polishing apparatus 100 and/or the controller 140 is provided by a power supply 150. Illustratively, the power supply 150 is shown connected to multiple components of the processing apparatus 100, including the transfer station 110, the factory interface 120, the loading robot 116 and the controller 140. In other embodiments separate power supplies are provided for two or more components of the polishing apparatus 100.

Figure 2:
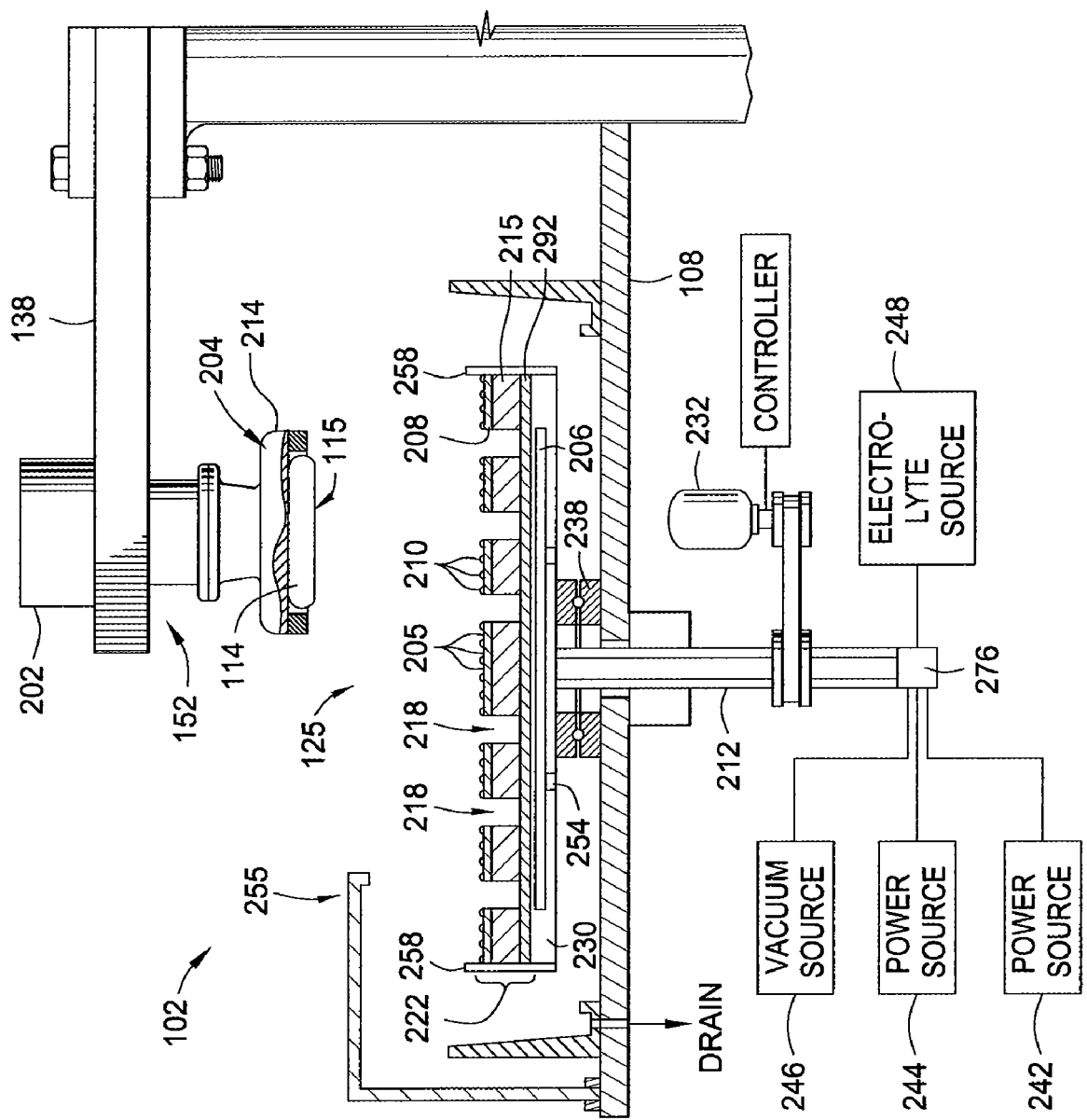
FIG. 2 is a sectional view of one embodiment of an ECMP station.

FIG. 2 depicts a sectional view of one of the planarizing head assemblies 152 positioned over one embodiment of ECMP station 102. The planarizing head assembly 152 generally comprises a drive system 202 coupled to a carrier head 204. The drive system 202 generally provides at least rotational motion to the carrier head 204. The carrier head 204 additionally may be actuated toward the ECMP station 102 such that the substrate 114, retained in the carrier head 204, may be disposed against a contact surface 125 of the ECMP station 102 during processing. The head assembly 152 may also translate movement in a path indicated by arrow 107 in FIG. 1 during processing. The drive system 202 is coupled to the controller 140 (in FIG. 1) that provides a signal to the drive system 202 for controlling the rotational speed and direction of the carrier head 204.

In one embodiment, the carrier head 204 may be a TITAN HEAD™ or TITAN PROFILER™ wafer carrier manufactured by Applied Materials, Inc. Generally, the carrier head 204 comprises a housing 214 and a retaining ring that defines a center recess in which the substrate 114 is retained. The retaining ring may circumscribe the substrate 114 disposed within the carrier head 204 to prevent the substrate 114 from slipping out from under the carrier head 204 during processing. The retaining ring can be made of plastic materials such as PPS, PEEK, and the like, or conductive materials such as stainless steel, Cu, Au, Pd, and the like, or some combination thereof. It is further contemplated that a conductive retaining ring may be electrically biased to control the electric field during the ECMP process or an electrochemical plating process. It is also contemplated that other planarizing or carrier heads may be utilized.

The ECMP station 102 generally includes a platen assembly 230 that is rotationally disposed on the base 108. The platen assembly 230 is supported above the base 108 by a bearing 238 so that the platen assembly 230 may be rotated relative to the base 108. An area of the base 108 circumscribed by the bearing 238 is open and provides a conduit for the electrical, mechanical, pneumatic, control signals and connections communicating with the platen assembly 230.

The ECMP station 102 includes a pad assembly 222 coupled to an upper surface of the platen assembly 230. The pad assembly 222 depicted in FIG. 2 includes a first conductive layer, such as a contact layer 208 comprising the upper surface of the pad assembly 222, an article support layer or subpad 215, and a second conductive layer, such as the electrode 292. In one embodiment, the contact layer 208 has a contact surface 125 that is adapted to contact the feature side 115 of the substrate 114 during processing. In another embodiment, the contact layer 208 may be further coated with a metallic coating that is adapted to at least partially contact the feature side 115 of the substrate 114. In another embodiment, the contact layer 208 is adapted to contact the feature side 115 of the substrate 114 and the contact layer 208 may be at least partially coated with the metallic coating and a portion of the contact layer 208 is exposed. In another embodiment, the contact layer 208 may be at least partially coated with the metallic coating and at least a portion of the coating is adapted to be consumed by the process to expose at least a portion of the contact layer 208. Alternatively or additionally, at least one or both of the contact layer 208 and the metallic coating may comprise abrasive particles (not shown in this view). The abrasive particles comprise ceramics, cured polymers, process resistant metals, oxides thereof and combinations thereof. In one embodiment, the abrasive particles are chosen to exhibit a hardness less than or equal to copper, to exhibit a hardness greater than copper, or a plurality of abrasive particles having a combination of differing hardnesses thereof. In one embodiment, the abrasive particles range in size from about 0.2 microns to about 1.0 microns.

Conventional bearings, rotary unions and slip rings, collectively referred to as rotary coupler 276, are provided such that electrical, mechanical, fluid, pneumatic, control signals and connections may be coupled between the base 108 and the rotating platen assembly 230 through a hollow drive shaft 212. The ECMP station 102 may also be coupled to a vacuum source 246 that provides a low partial pressure to the platen assembly 230 or other parts of the ECMP station 102. The platen assembly 230 is typically coupled to a motor 232 that provides the rotational motion to the platen assembly 230. The motor 232 is coupled to the controller 140 that provides a signal for controlling for the rotational speed and direction of the platen assembly 230. The platen assembly 230 is generally fabricated from a rigid material, such as aluminum, and has an upper surface that may be fabricated from the same material, or a rigid plastic. In one embodiment, the upper surface is fabricated from or coated with a dielectric material, such as CPVC. The upper surface may have a circular, rectangular or other plane form and is adapted to support a processing pad assembly 222 thereon.

Optionally, a magnetic element 254 may be disposed within the platen assembly 230 and is adapted to urge the processing pad assembly 222 toward the platen assembly 230. The magnetic element 254 is coupled to a power source 244 through the rotary coupler 276 and the magnetic element 254 is magnetically coupled to metallic material disposed in, on, or coupled to the processing pad assembly 222. It is contemplated that the magnetic element 254 may be coupled to the pad assembly 222 such that the pad assembly 222 is attracted to the platen assembly 230. The magnetic attraction between the magnetic element 254 and processing pad assembly 222 pulls the processing pad assembly 222 against the upper surface of the platen assembly 230 such that the processing pad assembly 222 advantageously remains stationary relative to the platen assembly 230 during processing. Uses of magnetic elements to couple a processing pad assembly are disclosed in U.S. Patent Publication No. 2005/0000801, filed Jun. 30, 2004, entitled "Method and Apparatus for Electrochemical Mechanical Processing," and incorporated herein by reference to the extent it is not inconsistent with this disclosure. It is also contemplated that the pad assembly 222 may be coupled to the upper surface of the platen assembly 230 by other means, such as adhesives and/or binders, or vacuum ports, and may not use a magnetic element.

An electrolytic fluid may be provided from an electrolyte source 248, through appropriate plumbing and controls to nozzle 255 above the process pad assembly 222 on planarizing module 102. Optionally, a plenum 206 may be defined in the platen assembly 230 to supply an electrolyte to the pad assembly 222. The electrolyte may be retained on an upper surface of the pad assembly 222, coupled to the platen assembly 230, by a wall 258 disposed about the perimeter of the platen assembly 230. The pad assembly 222 may have a plurality of holes (not shown) formed therethrough in communication with the plenum 206. A detailed description of an exemplary planarizing assembly that may be used can be found in the description of FIG. 2 in U.S. Patent Publication No. 2004/0163946, filed Dec. 23, 2003, entitled "Pad Assembly for Electrochemical Mechanical Processing," incorporated herein by reference to the extent the application is not inconsistent with this disclosure.

The electrode 292 is typically made of a conductive material, such as stainless steel, copper, aluminum, gold, silver and tungsten, among others. The electrode 292 can be a plate-like member or laminate, a plate having multiple apertures formed therethrough, or a plurality of electrode pieces disposed in a permeable membrane or container. For example, the electrode 292 may be a metal foil, a mesh made of metal wire or metal-coated wire, or a laminated metal layer on a polymer film compatible with the electrolyte, such as a polyimide, polyester, flouroethylene, polypropylene, or polyethylene sheet. The electrode 292 may act as a single electrode, or may comprise multiple independent electrode zones isolated from each other. Zoned electrodes are discussed in U.S. Patent Publication No. 2004/0082289, filed Aug. 15, 2003, entitled "Conductive Polishing Article for Electrochemical Mechanical Polishing," which is hereby incorporated by reference to the extent it is not inconsistent with this disclosure. The electrode 292 may be solid, impermeable to electrolyte, permeable to electrolyte or perforated, or combinations thereof. In the embodiment depicted in FIG. 2, the electrode 292 is solid, but may be perforated and configured to allow electrolyte therethrough. The electrode 292 is disposed on the upper surface of the platen assembly 230 and is coupled to the power source 242 through the platen assembly 230. Electrical connections from the electrode 292 and/or the platen assembly 230 may be routed through a hollow drive shaft 212 to provide electrical communication from the electrode 292 to at least one of the power sources 242 or 244.

The electrode 292, subpad 215, and contact layer 208 of the pad assembly 222 may be combined into a unitary assembly by the use of binders, adhesives, bonding, compression molding, or the like. In one embodiment, adhesive is used to attach the electrode 292, subpad 215, and contact layer 208 together. The adhesive generally is a pressure sensitive adhesive or a temperature sensitive adhesive and should be compatible with the process chemistry as well as with the different materials used for the electrode 292, subpad 215, and/or the contact layer 208. The adhesive may have a strong physical and/or chemical bond to the electrode 292, subpad 215, and the contact layer 208. However, selection of the adhesive may also depend upon the form of the electrode 292, subpad 215, and the contact layer 208. The adhesive bonding between the electrode 292, subpad 215, and the contact layer 208 may be increased by the surface morphology of the materials selected to form the pad assembly 222 (i.e., fabrics, screens, and perforations versus solids). For example, if the electrode 292 is fabricated from a screen, mesh, or perforated foil, a weaker adhesive may be selected due to the increased surface area of the electrode 292. It is also contemplated that stainless steel hook and loop or a stainless steel Velcro® connection may be used as the binder between the electrode 292 and the subpad 215 and/or the electrode 292 and the platen assembly 230. The pad assembly 222 is disposed on the upper surface of the platen assembly 230 and may be held there by magnetic attraction, static attraction, vacuum, adhesives, or the like. In one embodiment, adhesive is used to bind the electrode 292 of the pad assembly 222 to the upper surface of the platen assembly 230.

The contact layer 208 may be fabricated from polymeric materials compatible with the process chemistry, examples of which include polyurethane, polycarbonate, fluoropolymers, PTFE, PTFA, polyphenylene sulfide (PPS), or combinations thereof, and other polishing materials used in polishing substrate surfaces. The polymeric materials may be dielectric or, alternatively, conductive. The contact layer 208 may be smooth or patterned to facilitate distribution of the electrolyte over the surface of the pad assembly 222. Patterns may include posts, grooves, cutouts, perforations, channels or other contours in the surface. In one embodiment, the contact layer 208 comprises a plurality of abrasive particles in a polymer matrix, embossed or compression molded to form a plurality of posts 210 spaced apart by a plurality of interstitial areas 205. The posts 210 are arranged in a pattern on the contact layer 208 and may comprise shapes such as rectangles, ovals, circles, or combinations thereof, in any suitable pattern. The pad assembly 222 may further include perforations at least to the electrode 292.

In the case of a rectangular post, any one side may comprise a length from about 170 microns to about 250 microns in one embodiment. In another embodiment, the length of any one side of a rectangular post is greater than 250 microns, such as about 250 microns to about 2 mm. In yet another embodiment, the length of any one side of a rectangular post is between about 2 mm to about 4 mm. In the case of a circular post, the diameter is between about 170 microns to about 250 microns in one embodiment. In another embodiment, the diameter is greater than 250 microns, such as about 250 microns to about 2 mm. In yet another embodiment, the diameter is greater than 2 mm, such as about 2 mm to about 4 mm. The height of the posts 210 may range in size between about 30 microns to about 60 microns in one embodiment. In another embodiment, the height is greater than about 60 microns, such as about 60 microns to about 1 mm. In yet another embodiment, the height may be a suitable height up to and including about 4 mm.

In another embodiment, the pad assembly 222 may include conductive contact elements (not shown) adapted to extend above the contact layer 208. Examples of contact elements that may be used in the pad assembly 222 are described in U.S. Patent Publication No. 2002/0119286, filed Dec. 27, 2001, entitled "Conductive Polishing Article for Electrochemical Mechanical Polishing," which is incorporated by reference herein to the extent the application is not inconsistent with this disclosure. A detailed description of a process pad assembly and counterparts that may be used can be found in U.S. Patent Publication No. 2004/0163946, entitled "Pad Assembly for Electrochemical Mechanical Processing," which was previously incorporated by reference. Examples of conductive contact elements that may be found in the descriptions of FIGS. 3-13 in U.S. Patent Publication No. 2005/0000801, filed Jun. 30, 2004, entitled "Method and Apparatus for Electrochemical Mechanical Processing," which was previously incorporated by reference.

The subpad 215 is typically made of a material softer, or more compliant, than the material of the contact layer 208. The difference in hardness or modulus of elasticity between the contact layer 208 and the subpad 215 may be chosen to produce a desired polishing performance. The subpad 215 may also be compressible. Examples of suitable subpad 215 materials include, but are not limited to, open or closed-cell foamed polymer, elastomers, felt, urethane impregnated felt, plastics, and like materials compatible with the processing chemistries. The contact layer 208 is harder and less compliant than the subpad 215 so the posts 210 balance a suitable force distribution for maintaining sufficient contact with the substrate 114.

The plurality of perforations 218 may be formed in a rectangular pattern, a triangular pattern, or any other uniformly distributed pattern and generally has a percent open area of from about 10% to about 90% (i.e., the area of the holes open to the electrode as a percentage of the total surface area of the polishing layer). The plurality of perforations 218 may be molded in the pad assembly 222 as formed, or the perforations 218 may be formed by, for example, a steel rule die, an ultrasonic knife/punch, or a male/female die punch, among other forming methods. The application or process steps for coating and forming may be determined by the pre-coating topography of the contact layer 208, or the resulting topography desired on the contact layer 208. The perforations 218 may take any shape, such as circles, ovals, squares, rectangles, or combinations thereof. Care should be taken in perforating the pad assembly 222 as any irregularities in the contact surface 125 of the contact layer 208 may cause damage to the substrate 114. The location and open area percentage of the holes 218 in the pad assembly 222 controls the quantity and distribution of electrolyte contacting the electrode 292 and substrate 114 during processing, thereby controlling the rate of removal of material from the feature side 115 of the substrate 114 in a polishing operation, or the rate of deposition in a plating operation.

Processing Articles

Figure 3A:
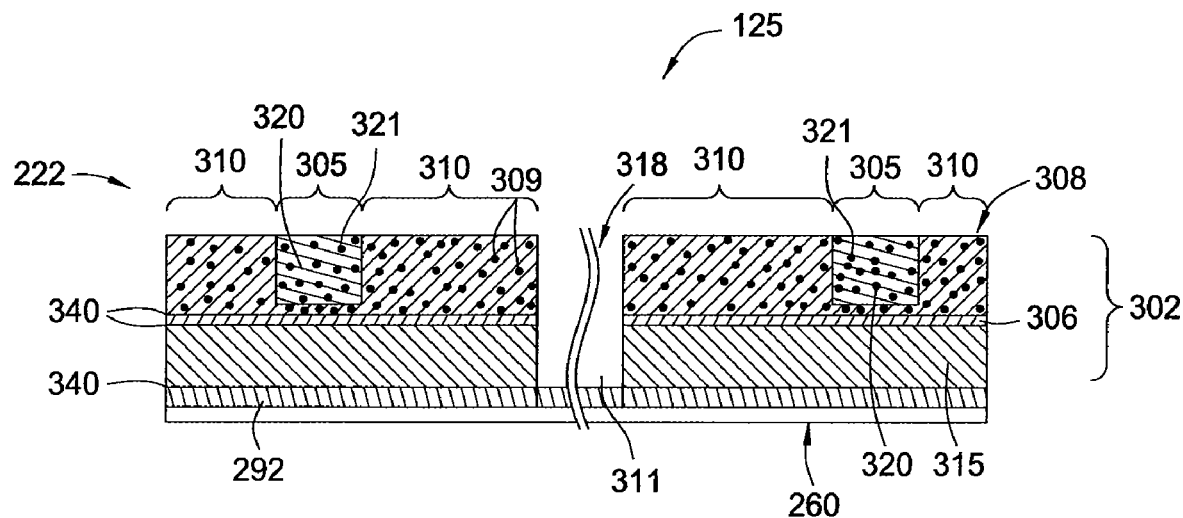
FIG. 3A is a partial schematic cross-sectional view of one embodiment of a pad assembly.

FIG. 3A is a partial schematic of one embodiment of a pad assembly 222. The pad assembly 222 comprises a pad body 302, which includes a first conductive layer, such as a contact layer 308 on a backing 306, an article support layer or subpad 315, and a second conductive layer, depicted here as an electrode 292, coupled together by a binder 340, such as an adhesive or a stainless steel hook and loop connection. The electrode is coupled mechanically or magnetically to an upper surface 260 of the platen assembly. The contact layer 308 comprises a plurality of posts 310 made of a plurality of abrasive particles 309 dispersed in a polymer binder, the area surrounding the posts 310 forming a plurality of interstitial areas 305 that are filled with a conductive coating 320. The pad assembly 222 also comprises a plurality of perforations 318 (only one is shown in this view) formed therethrough. Each of the plurality of perforations 318 extend through the contact layer 308, the backing 306, and the subpad 315 at least to the electrode 292 in order to allow the electrode 292 to be in electrical communication with the electrolyte, which is provided by suitable plumbing and controls to the nozzle 255 (FIG. 2).

In one embodiment, the contact layer 308 comprises abrasive particles 309 bound in a polymer matrix. The polymer matrix may be formed on the backing 306, formed on the subpad 315, or formed separately and subsequently coupled to the backing 306 or subpad 315. The contact layer 308 may be embossed or compression molded to form the plurality of posts 310. The conductive coating 320 may contain conductive particles in the form of flakes, filings, or other geometric form and may be made of metallic materials, such as copper, bronze, tin, zinc, alloys thereof, derivatives thereof, other metallic alloys or combinations thereof, having a hardness that is less than copper. The abrasive particles 309 may be process resistant metals, cured polymeric particles, ceramics, oxides thereof or combinations thereof. After a curing process, the posts 310 and the interstitial areas 305 form a foundation or template for the conductive coating 320. In another embodiment, the contact layer 308 is a fixed abrasive material, such as 3M™ Slurry Free™ fixed abrasive material. The fixed abrasive material comprising the contact layer 308 may be cut into a suitable shape, for example circular to be installed on a circular platen, and bonded to the subpad 315. Before or after bonding to the subpad 315, the conductive coating 320 may be applied to the upper surface of the contact layer 308. After bonding, the contact layer 308, the backing 306, and the subpad 315 may be perforated and coupled to the electrode 292.

In the embodiment shown in FIG. 3A, the conductive coating 320 is a metallic coating applied to, sprayed on, or otherwise coated on, the contact layer 308, using the pad assembly 222, specifically the pattern of posts 310, as a foundation or template for the conductive coating 320. The conductive coating 320 may further be embossed after application. In one embodiment, the conductive coating provides at least conductive functions to the contact layer 308 and comprises conductive materials such as tin, copper, bronze, zinc, or alloys thereof, or combinations thereof. In another embodiment, the coating 320 is a high purity tin/zinc alloy marketed under the trade name ECOPLATE™ 5030 by Chomerics, a division of Parker Hanniffin Corp. located in Woburn, Mass., U.S.A, that provides at least conducting functions to the contact layer 308.

In one embodiment, the conductive coating 320 may fill the interstitial areas 305 to produce a substantially planar contact surface 125 as shown, leaving the upper surface of the posts 310 exposed. The interstitial areas 305 may be coated with the conductive coating to a thickness between about 30 microns to about 50 microns, or of a thickness to equal the height of the posts 310. In another embodiment (not shown), the coating 320 may cover the posts 310 and fill the interstitial areas 305 to a thickness that equals the coating above the posts 310, to produce a substantially planar contact surface 125 made of the conductive coating 320. In this embodiment, the thickness of the conductive coating 320 may be greater than about 40 microns.

The pad assembly 222 is configured to provide physical abrasion by at least one of the plurality of posts 310, or the conductive coating 320 in the interstitial areas 305. Electrical power is provided globally to the pad body 302 by the conductive coating 320 that is adapted to couple to a power source (not shown). The electrode 292 is adapted to couple to the same or a separate power source and is configured to receive an independent and unequal bias from the power source in order to create a plurality of electrochemical cells 311 in the pad body 302. In the embodiment shown, the posts 310 are of a size, structure, and pattern to maintain contact with the substrate at multiple points while creating a foundation for the conductive coating 320. The contact layer 308 may be conditioned after a number of substrates have been processed to expose embedded abrasive particles within the posts 310.

Figure 3B:
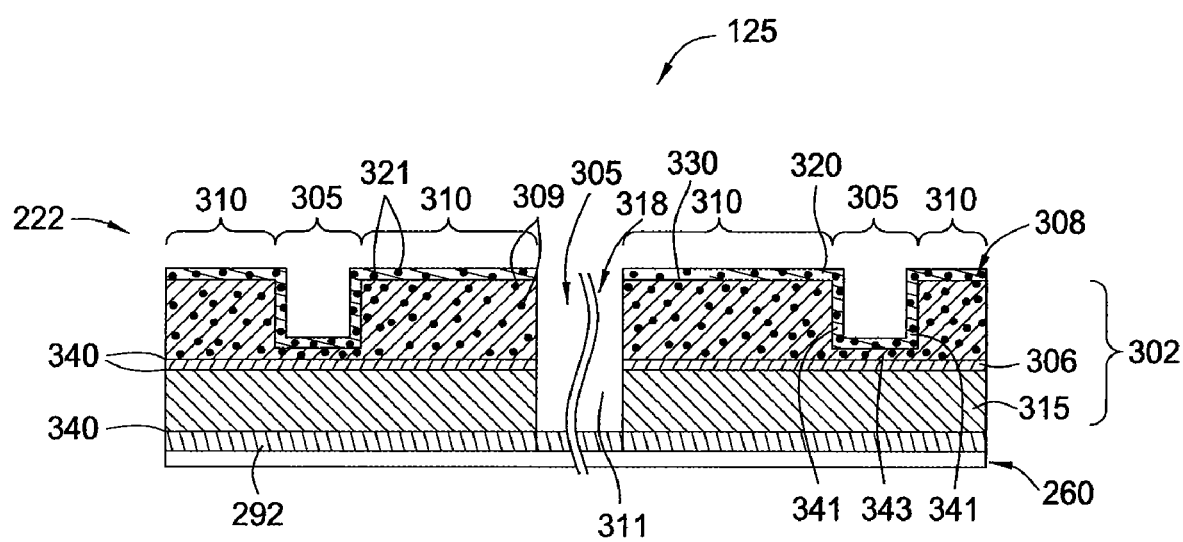
FIG. 3B is a partial schematic cross-sectional view of another embodiment of a pad assembly.

FIG. 3B is a partial schematic side-view of another embodiment of a process pad assembly 222. The pad assembly 222 comprises a pad body 302, which comprises a first conductive layer, such as a contact layer 308 on a backing 306, an article support layer or subpad 315, and a second conductive layer, such as an electrode 292 coupled together by a binder 340, such as an adhesive or a stainless steel hook and loop connection. The electrode is coupled mechanically or magnetically to an upper surface 260 of a platen assembly. In one embodiment, the contact layer 308 comprises a plurality of posts 310 made of a plurality of abrasive particles 309 dispersed in a polymer matrix, the posts 310 forming a plurality of interstitial areas 305. In another embodiment, the contact layer 308 comprises a fixed abrasive material, such as 3M™ Slurry Free™ fixed abrasive material. In both embodiments, the interstitial areas 305 are covered with a conductive coating 320 that forms a conductive layer 330.

In one embodiment, the interstitial areas 305 may have a bottom 343 that includes the conductive layer 330, sidewalls 341 that include the conductive layer 330, and the conductive layer 330 may also cover the posts 310. In another embodiment, the sidewalls 341 may not include the conductive layer 330, while the bottom 343 and the posts include the conductive layer 330. If one electrical connection (not shown) is to be used to couple the contact layer 308 to a power source, at least the bottom 343 must be coated with the conductive coating 320 to provide global electrical communication across the contact surface 125. If more than one electrical connection is used, multiple conductive areas may be formed across the contact layer 308, thereby allowing the conductive coating 320 to be applied on other areas of the contact layer 308 other than the bottom 343.

In the embodiment shown in FIG. 3B, the conductive coating 320 is applied to, sprayed on, or otherwise coated on, the contact layer 308, using the posts 310 and the interstitial areas 305 as a foundation or template for the conductive coating 320. The conductive layer 330 may have a thickness range from about 15 microns to about 30 microns. After application, the conductive coating 320 may be embossed. In one embodiment, the conductive coating provides at least conductive qualities to the contact layer and comprises conductive materials such as tin, copper, bronze, zinc, or alloys thereof, or combinations thereof, having a hardness less than copper. In another embodiment, the coating is a high purity tin/zinc alloy that provides at least conducting functions to the pad body 302 and is marketed under the trade name ECO-PLATE™ 5030 by Chomerics, a division of Parker Hanniffin Corp. located in Woburn, Mass., U.S.A.

The pad assembly 222 is configured to provide physical abrasion by at least one of the plurality of posts 310, or the conductive coating 320 in the interstitial areas 305. Electrical power is provided globally to the pad body 302 by the conductive coating 320 that is adapted to couple to a power source (not shown). The electrode 292 is adapted to couple to the same or a separate power source and is configured to receive an independent and unequal bias from the power source in order to create a plurality of electrochemical cells 311 in the pad body 302. In the embodiment shown, the posts 310 are of a size and pattern to maintain contact with the substrate at multiple points while creating a foundation for the conductive coating 320. The contact layer 308 may be conditioned after a number of substrates have been processed to expose embedded abrasive particles 309 within the posts 310.

Figure 4:
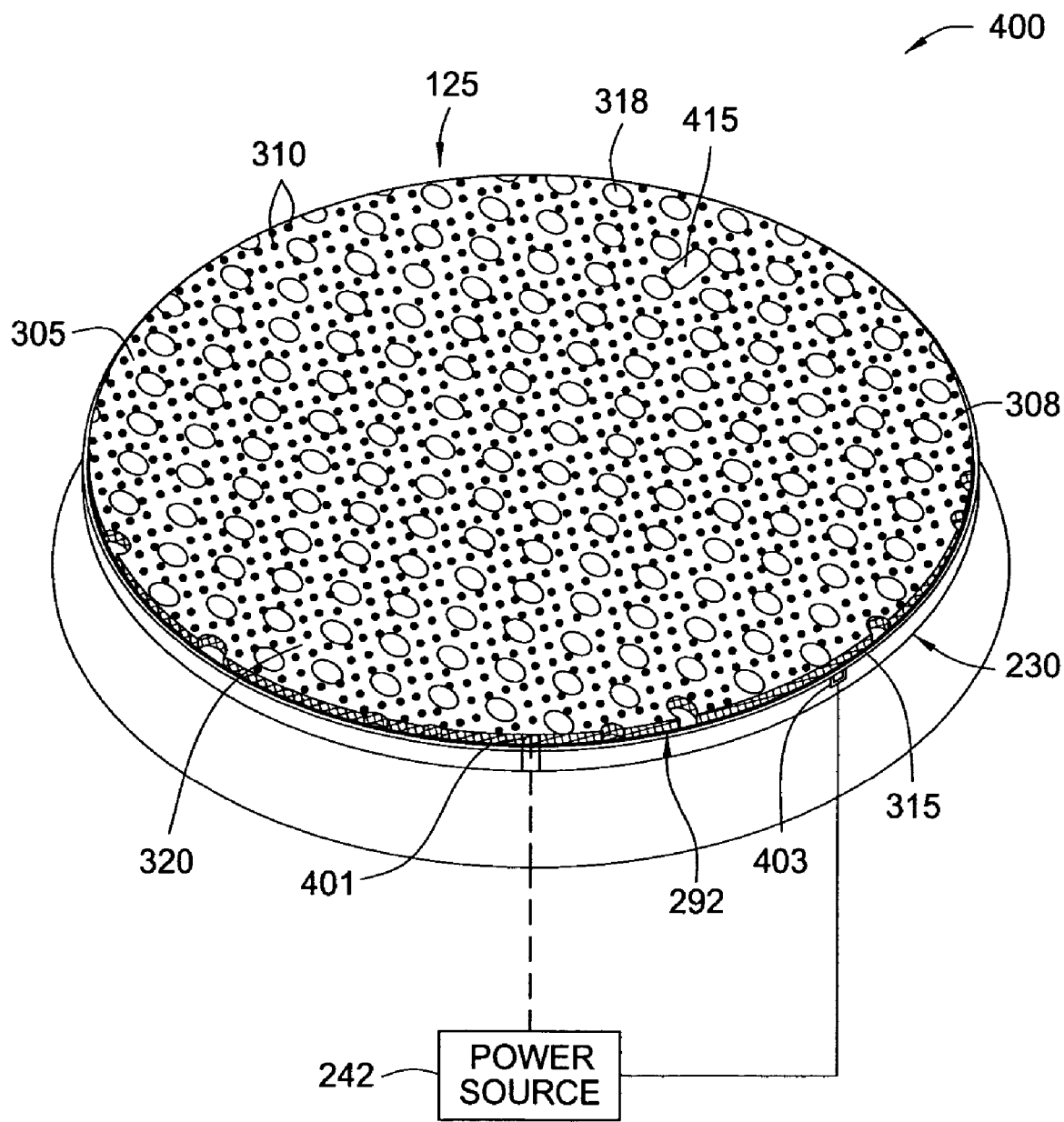
FIG. 4 is an isometric view of one embodiment of a pad assembly.

FIG. 4 is an isometric view of one embodiment an ECMP pad assembly 400 similar to the embodiment shown in FIG. 3A. The pad assembly 400 includes a contact layer 308 that comprises the plurality of posts 310 and interstitial areas 305 as shown in FIG. 3A, and a plurality of perforations 318. The interstitial areas 305 are coated, or alternatively filled, with a conductive coating 320. The conductive coating 320 in the interstitial areas 305 around the posts 310 form a collective conductive area across the contact layer 308. The contact layer 308 may be connected to a power source 242 by a conductive tab 401 adapted to releasably couple to the platen assembly 230, thereby providing at least an electrical connection to the power source 242. The conductive tab 401 may also be configured to provide a mechanical connection between the contact layer 308 and the platen assembly 230. The electrode 292 may be coupled to an opposing pole of the power source 242 by at least one conductive connector 403 to provide an independent voltage to the electrode 292. Other conductive connectors (not shown) may be coupled to the electrode 292 to provide power for a zoned electrode. For an ECMP process, the contact layer 308, adapted to contact and bias the substrate, may perform as an anode, while the electrode 292 will perform as a cathode. A suitable electrolyte is flowed onto the pad assembly and metallic ions will be removed from the substrate electrochemically. For an electrochemical plating process or ECMPP, the polarity of the electrode 292 and the contact layer 308 may be adjusted to use the apparatus in the plating process with an appropriate metal containing electrolyte. The pad assembly 400 also contains at least one window 415 that is adapted to provide access for an endpoint detection device.

Figure 5:
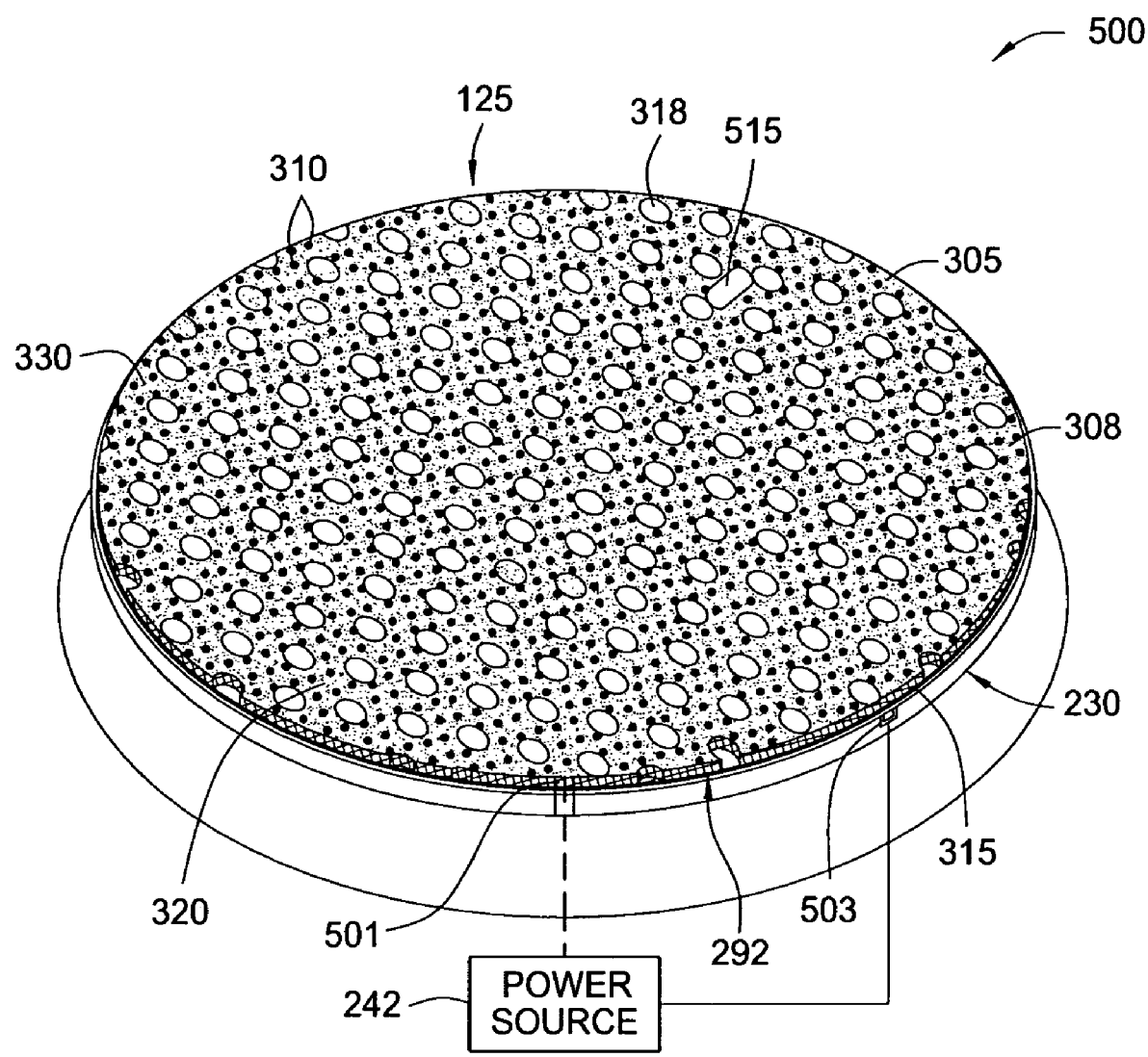
FIG. 5 is an isometric view of another embodiment of a pad assembly.

FIG. 5 depicts an isometric view of one embodiment of a pad assembly 500 similar to the embodiment of the pad assembly shown in FIG. 3B. In this embodiment, electrical communication is performed by the conductive coating 320 forming a conductive layer 330 that may cover the contact layer 308. Alternatively, the conductive layer 330 may not cover the posts 310, but covers and electrically connects the interstitial areas 305 in order to provide a conductive surface across the contact surface 125. The contact layer 308, with the conductive layer 330 thereon, may be in communication with power source 242 by a conductive tab 501, and the electrode 292 is in communication with the power source 242 by at least one conductive connector 503. Other conductive connectors (not shown) may be coupled to the electrode 292 to provide power for a zoned electrode. The pad assembly 500 also contains at least one window 515 that is adapted to provide access for an endpoint detection device.

The conductive coating process enables refurbishing or reuse of the process pad assembly 222 after the contact layer 308 has reached its planarizing and/or conductive potential. It is contemplated that a process kit, comprising at least the contact surface 308 coupled to the subpad 315, may be removed from the platen assembly and the conductive coating 320 reapplied after suitable surface preparation, arriving to a planarizing module in a clean wrapped package, and re-attached to the platen assembly for subsequent processing or planarizing.

While the foregoing is directed to embodiments of the present invention, other and further embodiments of the invention may be devised without departing from the basic scope thereof, and the scope thereof is determined by the claims that follow.

The invention claimed is:

1. A pad assembly for polishing a substrate, comprising:
a contact surface having a plurality of posts and a plurality of interstitial areas disposed on a backing; and
a subpad coupled to the backing adapted to be disposed on an electrode, wherein a conductive coating is applied to at least a bottom of the plurality of interstitial areas.

2. The pad assembly of claim 1, wherein the conductive coating is a metallic coating.

3. The pad assembly of claim 1, wherein the conductive coating is a copper material, a bronze material, tin/zinc alloy material, or combinations thereof.

4. The pad assembly of claim 1, wherein the conductive coating forms a conductive layer on a sidewall of each of the plurality of interstitial areas.

5. The pad assembly of claim 1, wherein the contact surface is adapted to couple to a power supply by a conductive tab.

6. The pad assembly of claim 1, wherein the pad assembly has a plurality of perforations.

7. A pad assembly for polishing a substrate, the pad assembly adapted to couple to a power source, the pad assembly comprising:
a first conductive layer having a contact surface adapted to polish the substrate, the contact surface having a conductive coating formed thereon; and
a second conductive layer coupled to and disposed below the first conductive layer with a subpad therebetween, wherein the second conductive layer is adapted to receive a voltage from the power source that is different than the first conductive layer.

8. The pad assembly of claim 7, wherein the pad assembly further has a plurality of perforations extending through the first conductive layer and the subpad to the second conductive layer.

9. The pad assembly of claim 7, wherein the conductive coating is a metal containing coating.

10. The pad assembly of claim 7, wherein the conductive coating is a copper material, a bronze material, tin/zinc alloy material, or combinations thereof.

11. The pad assembly of claim 7, wherein the contact surface is dielectric.

12. The pad assembly of claim 7, wherein the contact surface comprises:
 a plurality of posts; and
 a plurality of interstitial areas between the plurality of posts.

13. The pad assembly of claim 12, wherein the conductive coating fills the plurality of interstitial areas.

14. The pad assembly of claim 12, wherein the conductive coating is a copper material, a bronze material, tin/zinc alloy material, or combinations thereof.

15. The pad assembly of claim 12, wherein the conductive coating forms a conductive layer on at least a bottom of the plurality of interstitial areas.

16. The pad assembly of claim 7, wherein the contact surface includes a plurality of abrasive particles.

17. A pad assembly for polishing a substrate, comprising:
 a perforated contact surface having a plurality of posts and a plurality of interstitial areas disposed on a backing; and
 a subpad coupled to the backing and adapted to be disposed on an electrode, wherein a conductive coating is disposed on the contact surface and at least a bottom of the plurality of interstitial areas.

18. The pad assembly of claim 17, wherein the conductive coating is a metallic coating.

19. The pad assembly of claim 18, wherein the conductive coating is a copper material, a bronze material, tin/zinc alloy material, or combinations thereof.

20. A pad assembly for polishing a substrate, the pad assembly adapted to couple to a power source, the pad assembly comprising:
 a first conductive layer having a perforated contact surface coated with a conductive material, the contact surface having a plurality of posts adapted to polish the substrate and a plurality of interstitial areas adjacent the plurality of posts; and
 a second conductive layer coupled to and disposed below the first conductive layer with a subpad therebetween, wherein the second conductive layer is adapted to receive a voltage from the power source that is different from a voltage applied to the first conductive layer.

* * * * *

UNITED STATES PATENT AND TRADEMARK OFFICE
CERTIFICATE OF CORRECTION

PATENT NO. : 7,520,968 B2  Page 1 of 1
APPLICATION NO. : 11/243488
DATED : April 21, 2009
INVENTOR(S) : Mavliev et al.

It is certified that error appears in the above-identified patent and that said Letters Patent is hereby corrected as shown below:

Title Page, item 56

Please delete "2,457,510 A 12/1948 van Omum" and insert --2,457,510 A 12/1948 Van Ornum-- therefor;

Please delete "2,490,055 A 12/1949 Hotl" and insert --2,490,055 A 12/1949 Hoff-- therefor;

Please delete "2,657,177 A 10/1953 Rendet" and insert --2,657,177 A 10/1953 Rendel-- therefor;

Please delete "6,296,557 B1 10/2001 Walker" and insert --6,291,557 B1 9/2001 Yamamoto et al-- therefor;

Please delete "JP 2003-037158 5/2003" and insert --KR 2003-037158 5/2003-- therefor.

Signed and Sealed this

Fourteenth Day of July, 2009

JOHN DOLL
*Acting Director of the United States Patent and Trademark Office*